(12) United States Patent
Kasahara

(10) Patent No.: US 10,079,415 B2
(45) Date of Patent: Sep. 18, 2018

(54) STRUCTURE AND WIRING SUBSTRATE

(71) Applicant: NEC Corporation, Tokyo (JP)

(72) Inventor: Yoshiaki Kasahara, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/543,785

(22) PCT Filed: Jan. 5, 2016

(86) PCT No.: PCT/JP2016/000018
§ 371 (c)(1),
(2) Date: Jul. 14, 2017

(87) PCT Pub. No.: WO2016/129199
PCT Pub. Date: Aug. 18, 2016

(65) Prior Publication Data
US 2018/0013187 A1 Jan. 11, 2018

(30) Foreign Application Priority Data

Feb. 12, 2015 (JP) ................................. 2015-025092

(51) Int. Cl.
*H01P 3/08* (2006.01)
*H01P 1/20* (2006.01)
(Continued)

(52) U.S. Cl.
CPC .............. *H01P 1/2005* (2013.01); *H01P 1/16* (2013.01); *H05K 1/0236* (2013.01); *H05K 1/165* (2013.01);
(Continued)

(58) Field of Classification Search
CPC ........ H01P 3/085; H01P 3/088; H01P 1/2005; H01P 1/16; H05K 1/0236; H05K 1/165;
(Continued)

(56) References Cited

U.S. PATENT DOCUMENTS

| 7,215,007 B2 | 5/2007 | McKinzie, III et al. |
| 2007/0090398 A1 | 4/2007 | McKinzie, III |

(Continued)

FOREIGN PATENT DOCUMENTS

| EP | 2 221 923 A1 | 8/2010 |
| JP | 2010-010183 A | 1/2010 |

(Continued)

OTHER PUBLICATIONS

International Search Report of PCT/JP2016/000018 dated Mar. 22, 2016 [PCT/ISA/210].

*Primary Examiner* — Steven T Sawyer
(74) *Attorney, Agent, or Firm* — Sughrue Mion, PLLC

(57) ABSTRACT

Provided is a structure including a first conductor plane (101); a second conductor plane (102); a first transmission line (104) that is formed in a layer different from the first conductor plane (101) and the second conductor plane (102); a second transmission line (105) that is disposed so as to face the second conductor plane (102) in a layer opposite to the first transmission line (104) with respect to the second conductor plane (102); a first conductor via (103) that connects one end of the first transmission line (104) with the first conductor plane (101); a second conductor via (106) that connects another end of the first transmission line (104) with one end of the second transmission line (105); and a slit (107) that is formed on the second conductor plane (102).

10 Claims, 10 Drawing Sheets

(51) Int. Cl.
*H01P 1/16* (2006.01)
*H05K 1/02* (2006.01)
*H05K 1/18* (2006.01)
*H05K 1/16* (2006.01)

(52) U.S. Cl.
CPC ... *H05K 1/181* (2013.01); *H05K 2201/09309* (2013.01)

(58) Field of Classification Search
CPC ......... H05K 1/181; H05K 2201/09309; H05K 1/0225
USPC ........................................................ 333/204
See application file for complete search history.

(56) References Cited

U.S. PATENT DOCUMENTS

| | | | | |
|---|---|---|---|---|
| 2007/0152307 | A1* | 7/2007 | Mizuno | H01L 23/5225 257/663 |
| 2007/0176827 | A1 | 8/2007 | Itoh et al. | |
| 2009/0315648 | A1* | 12/2009 | Toyao | H01P 1/2005 333/238 |
| 2012/0032865 | A1 | 2/2012 | Toyao et al. | |
| 2012/0325537 | A1* | 12/2012 | Toyao | H05K 1/0236 174/260 |
| 2013/0003333 | A1* | 1/2013 | Toyao | H05K 1/0236 361/777 |
| 2013/0068515 | A1* | 3/2013 | Toyao | H05K 1/0236 174/260 |
| 2013/0106528 | A1* | 5/2013 | Christian | H05K 1/0251 333/33 |
| 2013/0107491 | A1 | 5/2013 | Imazato et al. | |
| 2013/0126225 | A1* | 5/2013 | Toyao | H05K 1/0236 174/262 |
| 2013/0140071 | A1* | 6/2013 | Toyao | H05K 1/0236 174/260 |
| 2013/0246994 | A1* | 9/2013 | Morishita | H05K 1/0228 716/136 |
| 2014/0028412 | A1* | 1/2014 | Sasaki | H03H 7/0138 333/12 |

FOREIGN PATENT DOCUMENTS

| | | |
|---|---|---|
| JP | 2010-199881 A | 9/2010 |
| JP | 2013-255259 A | 12/2013 |
| WO | 2013/168377 A1 | 11/2013 |

* cited by examiner

STRUCTURE AND WIRING SUBSTRATE

CROSS REFERENCE TO RELATED APPLICATIONS

This application is a National Stage of International Application No. PCT/JP2016/000018, filed Jan. 5, 2016, claiming priority based on Japanese Patent Application No. 2015-025092, filed Feb. 12, 2015, the contents of all of which are incorporated herein by reference in their entirety.

TECHNICAL FIELD

The present invention relates to a structure and a wiring substrate.

BACKGROUND ART

In an electronic device in which a plurality of conductor planes are present, for example, a current flowing into a circuit during switching of a digital circuit induces a magnetic field and a voltage fluctuation caused during switching induces an electric field, so that electromagnetic waves are generated. The electromagnetic waves become electromagnetic noise propagating through a parallel flat line formed of conductor planes. The electromagnetic noise causes problems such as instability of operation of other circuits and deterioration in radio performance of the device. Accordingly, if it is possible to establish a technique for suppressing the electromagnetic noise, the stability of circuits and the radio performance of the device can be improved.

Examples of a conventional technique employed to suppress the electromagnetic noise include a method of disposing a decoupling capacitor between conductor planes. However, the conventional technique has the following problem.

In the case of a technique using a decoupling capacitor, an inevitable parasitic inductance of a capacitor makes it difficult to set a self resonant frequency to a high frequency of several hundred MHz. Accordingly, in general, the technique using a decoupling capacitor can be applied to a frequency of at most about several hundred MHz, while it cannot be applied to a high frequency band used for radio communication in recent years (for example, frequency bands of 2.4 GHz and 5.2 GHz which are used for wireless LAN, and frequency bands of 1.8 GHz, 2.6 GHz, and 3.5 GHz which are used for LTE (Long Term Evolution).

As techniques for solving the above-mentioned problem, techniques using a structure are disclosed in, for example, the Specification of U.S. Pat. No. 7,215,007 (PTL 1), Japanese Unexamined Patent Application Publication No. 2010-199881 (PTL 2), and Japanese Unexamined Patent Application Publication No. 2010-10183 (PTL 3). The structure disclosed in Patent Literature 1, 2, and 3 is a structure having EBG (Electromagnetic Band Gap) characteristics having a dispersion relation with a band gap for inhibiting propagation of electromagnetic waves at a characteristic frequency (this structure is hereinafter referred to as an EBG structure). This structure can suppress propagation of electromagnetic noise between power supply planes. The use of the technique using the EPG structure makes it possible to obtain an effect of suppressing electromagnetic noise in a high frequency band of GHz.

CITATION LIST

Patent Literature

[PTL 1] Specification of U.S. Pat. No. 7,215,007
[PTL 2] Japanese Unexamined Patent Application Publication No. 2010-199881
[PTL 3] Japanese Unexamined Patent Application Publication No. 2010-10183

SUMMARY OF INVENTION

Technical Problem

In recent electronic devices, miniaturization has advanced and wiring substrates have become complicated. Accordingly, the EBG structure, which is a structure for suppressing electromagnetic noise, is preferably as compact as possible. However, the structure disclosed in PTL 1 or the like has a problem that its size is large.

Object of the Present Invention

Therefore, an object of the present invention is to make it possible provide a compact EBG structure, and a wiring substrate including the structure.

Solution to Problem

To solve the above-mentioned problems, a structure and a wiring substrate according to the present invention mainly employ the following characteristic configurations.

(1) A structure according to the present invention includes:

a first conductor plane;

a second conductor plane disposed so as to face the first conductor plane;

a first transmission line that is formed in a layer different from the first conductor plane and the second conductor plane and is disposed so as to face the second conductor plane;

a second transmission line that is formed in a layer different from the first conductor plane and the second conductor plane and is disposed so as to face the second conductor plane in a layer opposite to the first transmission line with respect to the second conductor plane;

a first conductor via that connects one end of the first transmission line with the first conductor plane;

a second conductor via that connects another end of the first transmission line with one end of the second transmission line; and a slit that is formed on the second conductor plane so as to partially intersect with one of the first transmission line and the second transmission line in a plan view.

(2) A wiring substrate according to the present invention includes a structure including:

a first conductor plane;

a second conductor plane disposed so as to face the first conductor plane;

a first transmission line that is formed in a layer different from the first conductor plane and the second conductor plane and is disposed so as to face the second conductor plane;

a second transmission line that is formed in a layer different from the first conductor plane and the second conductor plane and is disposed so as to face the second conductor plane in a layer opposite to the first transmission line with respect to the second conductor plane;

a first conductor via that connects one end of the first transmission line with the first conductor plane;

a second conductor via that connects another end of the first transmission line with one end of the second transmission line; and a slit that is formed on the second conductor plane so as to partially intersect with one of the first transmission line and the second transmission line in a plan view.

Advantageous Effects of Invention

A structure and a wiring substrate according to the present invention provide the following advantageous effects.

That is, according to the present invention, in the first and second conductor planes forming a parallel flat line, the first transmission line and the second transmission line are arranged over two layers adjacent to the second conductor plane and are caused to operate as a series of open stubs, thereby making it possible to reduce the area occupied by the open stubs. In addition, a slit is further provided as an inductance imparting member on the second conductor plane that operates as a return path for the open stubs, so that a miniaturized EBG structure can be more reliably achieved.

DESCRIPTION OF EMBODIMENTS

Figure 1:
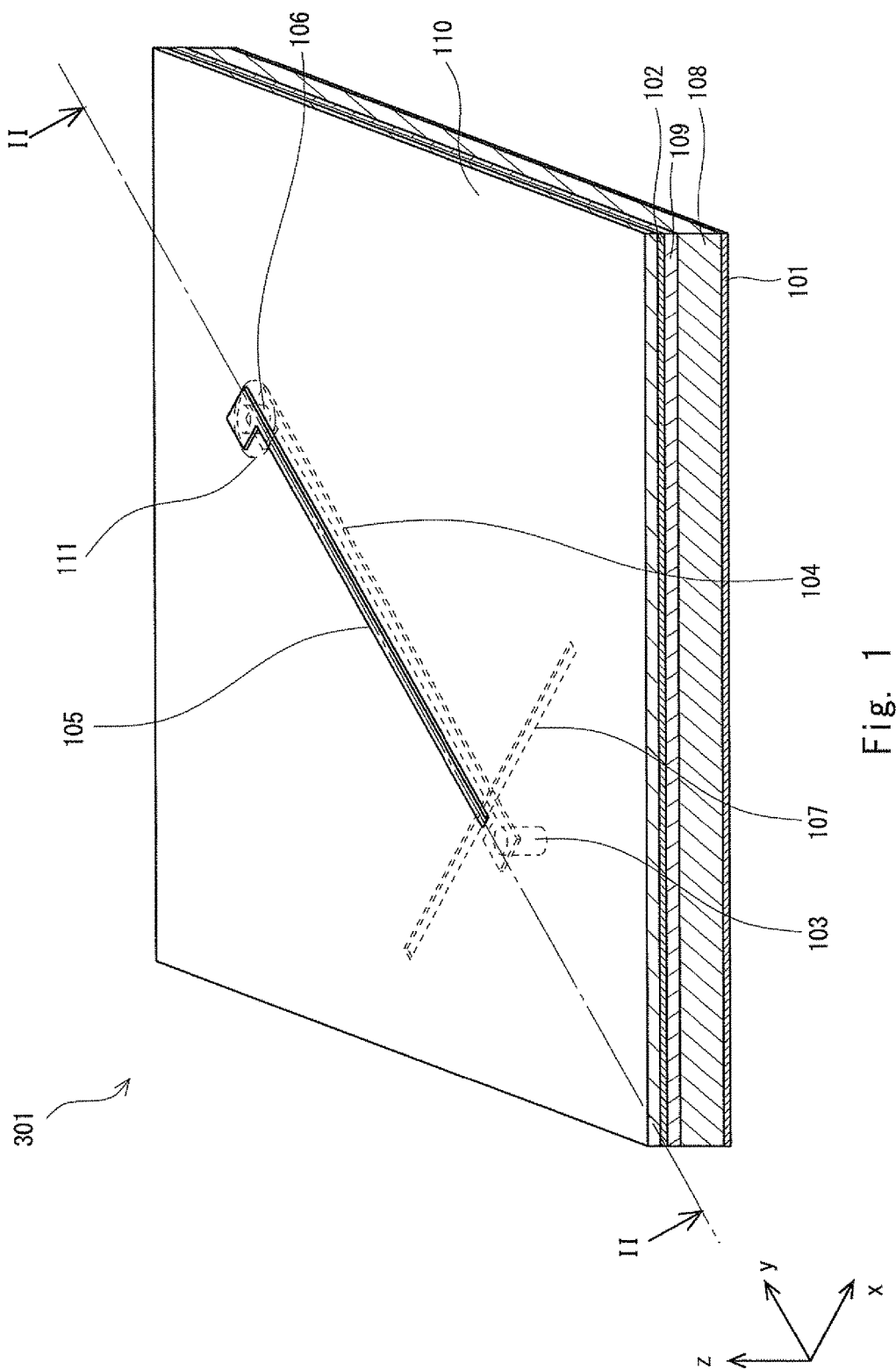
FIG. 1 is a perspective view showing an appearance of a structure according to an embodiment of the present invention.

Preferred embodiments of a structure and a wiring substrate according to the present invention will be described below with reference to the accompanying drawings. Note that in the drawings, like components are denoted by like reference numerals, and descriptions thereof are omitted as appropriate. Reference numerals in the drawings are assigned to the components by way of example to facilitate understanding of the invention, and are not intended to limit the present invention to modes illustrated in the drawings. Further, in each of the following embodiments, a substrate thickness direction (i.e., for example, a longitudinal direction or a z-axis direction in FIG. 1) is expressed as being a "thickness direction".

(Features of the Present Invention)

Prior to giving descriptions of embodiments of the present invention, an outline of features of the present invention will now be given. A main object of the present invention is to provide a structure including: a first conductor plane; a second conductor plane disposed so as to face the first conductor plane; a first transmission line that is formed in a layer different from the first conductor plane and the second conductor plane and is disposed so as to face the second conductor plane; a second transmission line that is formed in a layer different from the first conductor plane and the second conductor plane and is disposed so as to face the second conductor plane in a layer opposite to the first transmission line with respect to the second conductor plane; a first conductor via that connects one end of the first transmission line with the first conductor plane; a second conductor via that connects another end of the first transmission line with one end of the second transmission line; and a slit that is formed on the second conductor plane so as to partially intersect with one of the first transmission line and the second transmission line in a plan view. Thus, a compact EBG structure can be achieved.

[Embodiments]

(Configuration Examples of Embodiment)

Figure 2:
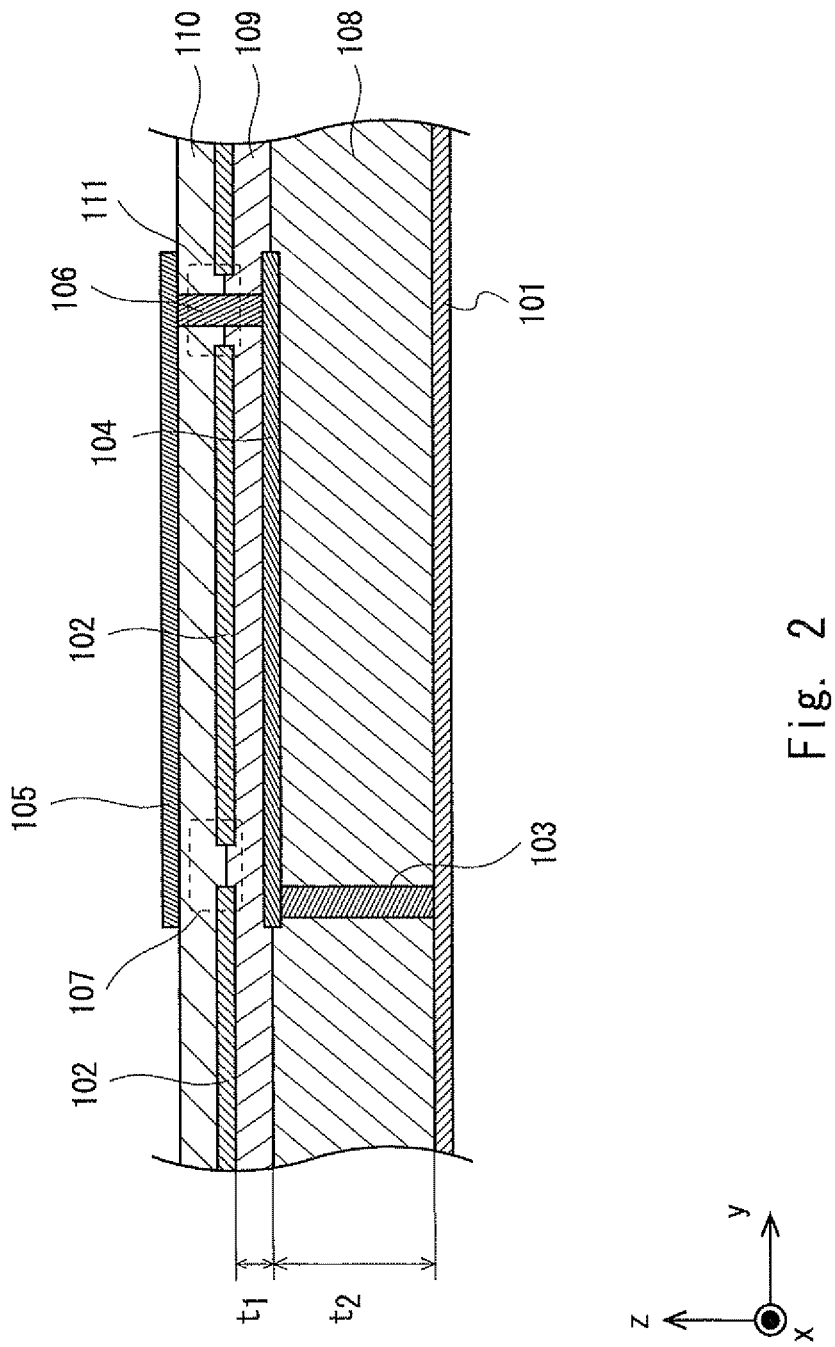
FIG. 2 is a sectional view showing an example of a sectional structure of the structure shown in FIG. 1.

First, a configuration of a structure according to an embodiment will be described with reference to FIGS. 1 and 2. FIG. 1 is a perspective view showing an appearance of a structure according to an embodiment of the present invention, and illustrates an example of an EBG structure according to this embodiment. FIG. 2 is a sectional view showing an example of a sectional structure of the structure shown in FIG. 1. The sectional view of FIG. 2 illustrates a section taken along a line II-II shown in FIG. 1.

As shown in the perspective view of FIG. 1 and the sectional view of FIG. 2, the structure according to this embodiment includes at least a first conductor plane 101 (first conductor), a second conductor plane 102 (second conductor), a first transmission line 104, a second transmission line 105, a first conductor via 103, a second conductor via 106, a slit 107 (inductance imparting member), and a clearance 111.

The second conductor plane 102 faces the first conductor plane 101. In the example shown in FIG. 1, the first transmission line 104 is provided in a region sandwiched between the first conductor plane 101 and the second conductor plane 102 as shown in FIG. 2, and is formed in a layer (layer adjacent to the second conductor plane 102) which is different from the first conductor plane 101 and the second conductor plane 102. The first transmission line 104 is disposed so as to face the second conductor plane 102 and linearly stretches in a y-axis direction shown in FIG. 1.

On the other hand, the second transmission line 105 is provided in a region above the second conductor plane 102 (i.e., in a layer that is opposite to the first transmission line 104 with respect to the second conductor plane 102 and is adjacent to the second conductor plane 102), and is formed in a layer different from the first conductor plane 101 and the second conductor plane 102. Like the first transmission line 104, the second transmission line 105 is disposed so as to face the second conductor plane 102 and linearly stretches in a y-axis direction shown in FIG. 1.

One end of the first transmission line 104 is connected with the first conductor plane 101 in a direct current way through the first conductor via 103. The other end of the first transmission line 104 is connected with one end of the second transmission line 105 through the second conductor via 106. The other end of the second transmission line 105 is an open end. The other end of the first transmission line 104 is connected with one end of the second transmission line 105 through the second conductor via 106, thereby allowing the first transmission line 104, the second transmission line 105, and the second conductor via 106 to behave as a series of transmission lines (open stubs) having an open end using the second conductor plane 102 as a return path.

In this case, particularly when the first transmission line 104 is provided between the first conductor plane 101 and the second conductor plane 102, as shown in FIG. 2, a distance $t_1$ between the second conductor plane 102 and the first transmission line 104 is desirably smaller than a distance $t_2$ between the first conductor plane 101 and the first transmission line 104. For example, the distance $t_1$ between the second conductor plane 102 and the first transmission line 104 is desirably equal to or less than a half (½) of the distance $t_2$ between the first conductor plane 101 and the first transmission line 104 ($t_1 \leq (½) \times t_2$). Like the distance $t_1$ between the second conductor plane 102 and the first transmission line 104, the distance between the second conductor plane 102 and the second transmission line 105 is desirably smaller than the distance $t_2$ between the first conductor plane 101 and the first transmission line 104.

Further, the first conductor via 103 stretches in the z-axis direction (thickness direction) and extends from the upper surface of a first dielectric layer 108 to the lower surface thereof so as to connect one end of the first transmission line 104 to the first conductor plane 101 as described above. On the other hand, the second conductor via 106 stretches in the z-axis direction (thickness direction) and extends from the upper surface of a third dielectric layer 110 to the lower surface of a second dielectric layer 109, which is formed on the lower surface of the third dielectric layer 110 through the second conductor plane 102, so as to connect the other end of the first transmission line 104 to one end of the second transmission line 105 as described above.

The slit 107 is provided on the second conductor plane 102 and disposed so as to partially intersect with the first transmission line 104 or the second transmission line 105 in a plan view. In particular, in the example shown in FIG. 1, the slit 107 is provided so as to stretch to both sides of the first transmission line 104 in the x-axis direction, which is perpendicular to the y-axis direction of the first transmission line 104, from a starting point where the slit 107 overlaps one end of the first transmission line 104 in a plan view, i.e., in the z-axis direction (thickness direction).

The structure according to this embodiment will be described in more detail below. The structure according to this embodiment is formed in, for example, a wiring substrate such as a printed wiring board, and behaves as a structure having EBG (Electromagnetic Band Gap) characteristics (hereinafter referred to as an EBG structure). The EBG structure includes a unit structure 301, as described below, which includes at least the first conductor plane 101 and the second conductor plane 102 which are disposed in parallel at an interval in the thickness direction (z-axis direction shown in FIG. 1).

Specifically, the unit structure 301 is a set of components of the structure shown in FIG. 1. As described above with reference to FIG. 1, the unit structure 301 includes at least the first transmission line 104 disposed in a layer different from the first conductor plane 101 and the second conductor plane 102, the second transmission line 105, the slit 107 formed on the second conductor plane 102, the conductor via 103 that electrically connects one end of the first transmission line 104 with the first conductor plane 101, and the second conductor via 106 that electrically connects the other end of the first transmission line 104 with one end of the second transmission line 105, in addition to the first conductor plane 101 and the second conductor plane 102. As described above, the slit 107 is provided on the second conductor plane 102, is provided so as to partially intersect with the first transmission line 104 or the second transmission line 105 in a plan view, and stretches to both sides of the first transmission line 104 from the starting point where the slit 107 overlaps the first transmission line 104 in the z-axis direction (thickness direction). The second conductor plane 102 is provided with the clearance 111 at the location corresponding to the second conductor via 106 so as to avoid electrical contact with the second conductor via 106.

In this case, when the length (electrical length) of the slit 107 is represented by L and the effective transmission line length (electrical length) of the open stub, which is formed of the first transmission line 104, the second transmission line 105, and the second conductor via 106, is represented by D, the slit length L is, in general, desirably twice or less as long as the effective transmission line length D of the open stub (L≤2×D) so that the area occupied by the slit 107 can be reduced. If possible, it is desirable to form the slit 107 so as to overlap the first transmission line 104 or the second transmission line 105 in a plan view at least at a location where (L/2−L/4) or more and (L/2+L/4) or less from the slit end of the slit 107 are satisfied. It is further desirable to form the first transmission line 104 so as to overlap the split 107 in a plan view at least at a location within a range of (D/8) or less from a connection point between the first transmission line 104 and the first conductor via 103. This is because the miniaturization effect obtained by the slit 107 can be increased.

The EBG structure illustrated in FIGS. 1 and 2 further includes: the first dielectric layer 108, which is stacked on one side (the upper surface side: the side on which the second conductor plane 102 is located) of the first conductor plane 101 in the thickness direction between the first conductor plane 101 and the second conductor plane 102; the second dielectric layer 109 which is stacked on one side (upper surface side) of the first dielectric layer 108 in the thickness direction; and the third dielectric layer 110 which is stacked on one side (upper surface side) of the second conductor plane 102 in the thickness direction. Specifically, the first conductor plane 101 is disposed on the other side (lower surface side) of the first dielectric layer 108 in the thickness direction, and the second conductor plane 102 is disposed between one side (upper surface side) of the second dielectric layer 109 in the thickness direction and the other side (lower surface side) of the third dielectric layer 110 in the thickness direction.

As shown in FIG. 2, the first transmission line 104 is disposed between the other side of the second dielectric layer 109 in the thickness direction and one side (upper surface side) of the first dielectric layer 108. The second transmission line 105 is disposed on one side (upper surface side) of the third dielectric layer 110 in the thickness direction. The slit 107 is provided on the second conductor plane 102.

As shown in FIG. 2, the first conductor via 103 stretches in the z-axis direction (thickness direction), extends from one side (upper surface side) of the first dielectric layer 108 to the other side (lower surface side) thereof, and electrically connects one end of the first transmission line 104 with the first conductor plane 101. On the other hand, the second conductor via 106 stretches in the z-axis direction (thickness direction), extends from one side (upper surface side) of the third dielectric layer 110 to the other side (lower surface side) of the second dielectric layer 109, and electrically connects the first transmission line 104 with the second transmission line 105. The clearance 111 is disposed at a location where the second conductor via 106 is disposed on the second conductor plane 102 so as to avoid electrical contact of the second conductor plane 102 with the second conductor via 106. Note that as shown in FIG. 1, the components described above, i.e., the first conductor plane 101, the second conductor plane 102, the first transmission line 104, the second transmission line 105, the slit 107, the first conductor via 103, the second conductor via 106, and the clearance 111, constitute the unit structure 301, which makes it possible to repeatedly arrange a large number of unit structures 301.

Figure 3:
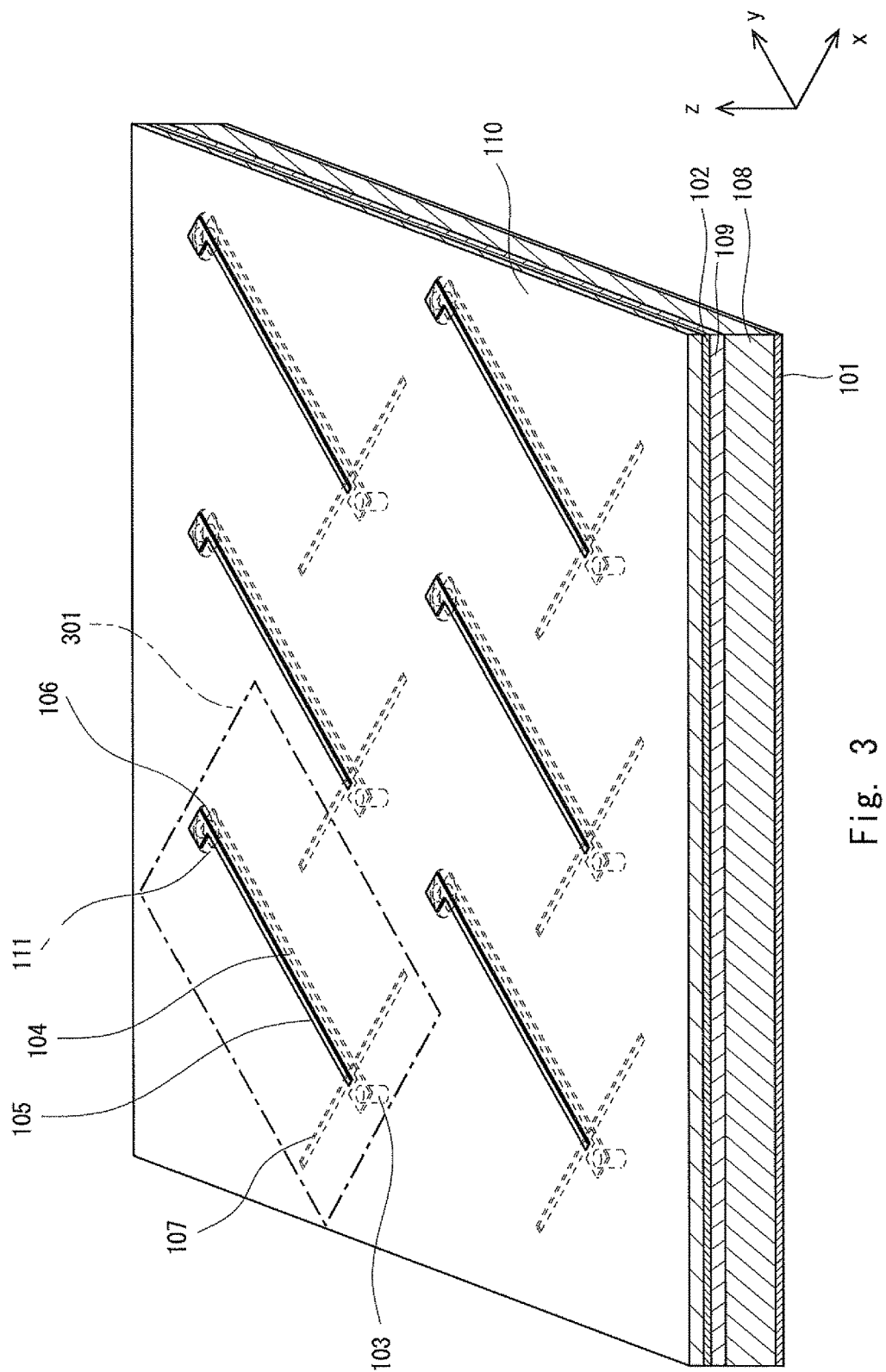
FIG. 3 is a perspective view of the structure when a plurality of structures shown in FIG. 1 are arranged.

A single unit structure 301 like the unit structure shown in FIG. 1 also has a filter effect that blocks electromagnetic noise. However, as shown in FIG. 3, it is desirable to arrange a large number of unit structures 301 shown in FIG. 1. FIG. 3 is a perspective view showing the structure according to the embodiment of the present invention when a plurality of structures shown in FIG. 1 are arranged. A dashed-dotted line indicates the region of a single unit structure 301 shown in FIG. 1. Note that in the structure shown in FIG. 3, the unit structures 301 that are regularly arranged are illustrated. However, according to the present invention, the unit structures 301 need not necessarily be arranged regularly as shown in FIG. 3, but instead may be arranged randomly. Further, in the structure shown in FIG. 3, the arrangement of a large number of unit structures 301 having the same shape is illustrated. However, the unit structures 301 need not necessarily have the same shape, and various types of unit structures 301 in which, for example, the first transmission lines 104 have different shapes, the second transmission lines have different shapes, or the slits 107 have different shapes, may be arranged.

(Operation Principle of Embodiment)

Figure 4:
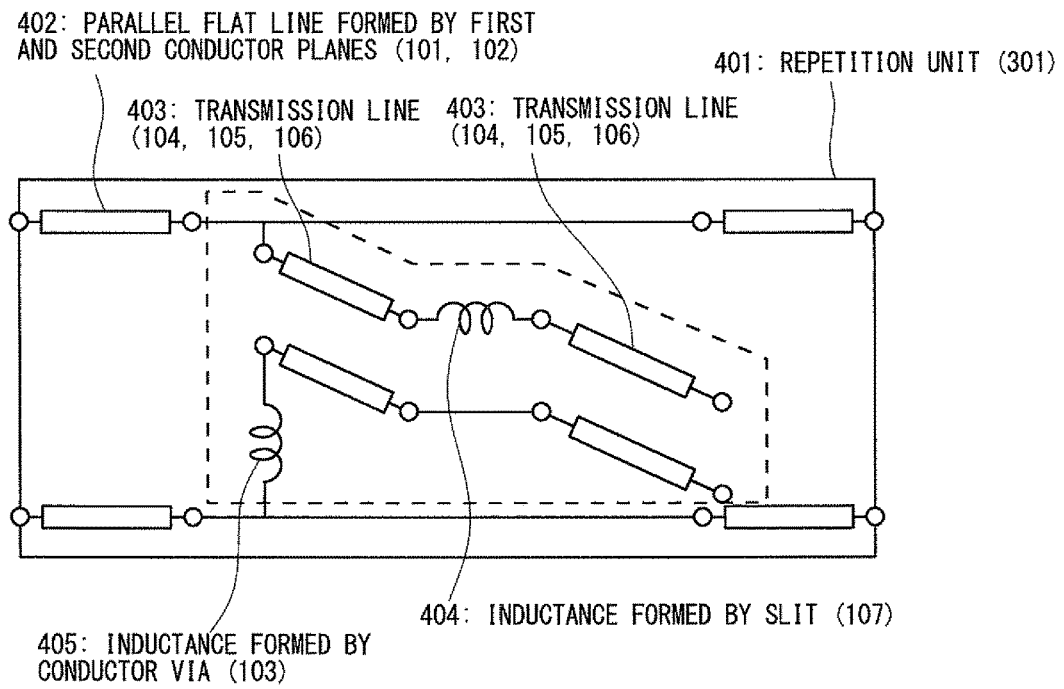
FIG. 4 is a circuit diagram showing an example of an equivalent circuit in a direction along any straight line within an xy plane in the structure shown in FIG. 3.
Figure 5:
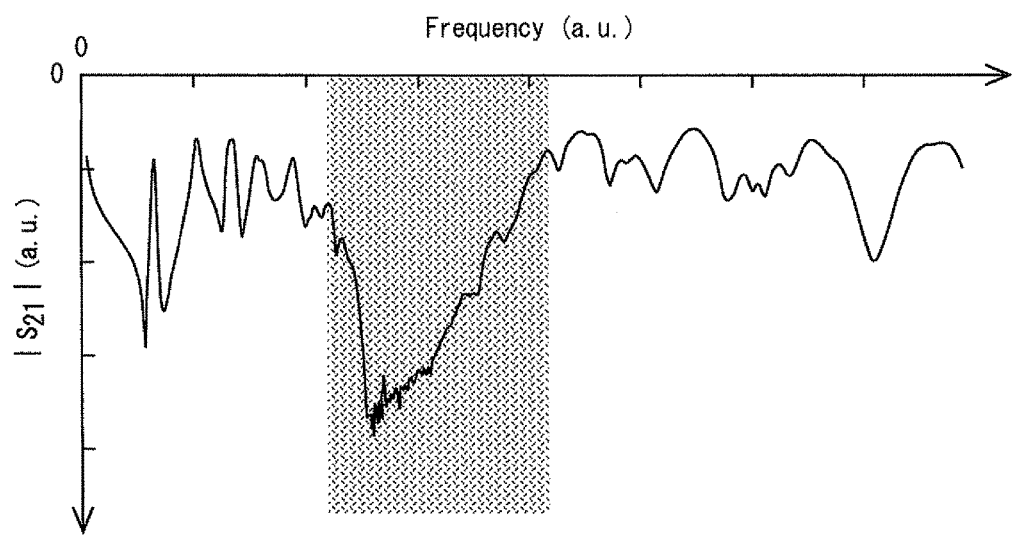
FIG. 5 is an explanatory diagram showing an example of an S parameter for an EBG structure according to an embodiment of the present invention.

Next, the basic operation principle of the above-described EBG structure will be described. FIG. 4 is a circuit diagram showing an example of an equivalent circuit in a direction along any straight line within an xy plane in the structure shown in FIG. 3 as this embodiment, and illustrates an equivalent circuit diagram of the EBG structure according to this embodiment. FIG. 5 is an explanatory diagram showing an example of an S parameter for the EBG structure according to the embodiment of the present invention, and illustrates an effect of the EBG structure according to this embodiment.

As shown in FIG. 4, in the equivalent circuit of the structure according to this embodiment, a repetition unit 401 corresponding to the unit structure 301 includes: a parallel flat line 402, which is formed of the first conductor plane 101 and the second conductor plane 102; a transmission line 403, which is configured as an open stub by the first transmission line 104, the second transmission line 105, and the second conductor via 106; an inductance 404 which is added by the slit 107 and formed in the middle of the first transmission line 403; and an inductance 405 which is added by the first conductor via 103. The repetition unit 401 is a single equivalent circuit of the unit structure 301 shown in FIG. 3.

In the equivalent circuit diagram shown in FIG. 4, the slit 107 is described as the inductance 404. However, in practice, a slot line (short stub) at a short end formed by the slit 107 is added to the transmission line 403. Assuming herein that the length of the short stub is represented by $l$ and the wavelength of a target electromagnetic wave is represented by $\lambda$, when the length $l$ of the short stub is equal to or more than $\lambda \times 2(n-1)/4$ and equal to or less than $\lambda \times (2n-1)/4$ (n: a natural number), the short stub formed by the slit 107 behaves as an inductance, and thus the slit 107 can be described as an inductance. Accordingly, the structure according to the embodiment can be described using the equivalent circuit shown in FIG. 4.

A graph shown in FIG. 5 shows the actual measurement results of the S parameter (S21) for the EBG structure according to this embodiment. In FIG. 5, the vertical axis represents the propagation characteristic S21, and the horizontal axis represents a frequency. The graph shown in FIG. 5 represents the propagation characteristic S21 between measurement ports at locations where five structures illustrated in FIG. 6, which is described later, are disposed between two measurement ports.

In FIG. 5, a hatched area in which the value of the propagation characteristic S21 is small represents a band gap. An index value leff/$\lambda$g for the size of the EBG structure can be calculated using a wavelength $\lambda$g within the pipe at a band gap start frequency that can be read from the actual measurement results illustrated in FIG. 5, and a length leff obtained when a pattern occupied area of the created structure is converted to a square. The index value leff/$\lambda$g which is calculated using the actual measurement results illustrated in FIG. 5 and the actual size of the structure is about ($1/38$). On the other hand, for example, when the same index value leff/$\lambda$g is calculated using the measurement results in the EBG structure disclosed in PTL 1 of the related art, leff/$\lambda$g=($1/12$) holds. Thus, it can be confirmed that the EBG structure of this embodiment is smaller than that of the related art.

In order for each slit 107 to effectively operate as an inductance, it is necessary to excite the electromagnetic wave, which propagates through the first transmission line 104, at a location in the vicinity of the center of the slit 107, so that the slit 107 can operate as a short-end slot line. Accordingly, it is necessary to induce electric charges at both sides of the slit 107, which is provided on the second conductor plane 102 having a planar shape and serving as a return path for the first transmission line 104 and the second transmission line 105, in the vicinity of the center of the slit 107. Accordingly, the first transmission line 104 or the second transmission line 105 desirably intersects with the slit 107 in a plan view at least in the vicinity of the center of the slit 107.

Different current standing waves are generated depending on the frequency in the first transmission line 104, the second transmission line 105, and the second conductor plane 102 serving as a return path for the first transmission line and the second transmission line. For example, in the equivalent circuit illustrated in FIG. 4, when the contribution of the parallel flat line 402 and the contribution of the inductance 405 due to the first conductor via 103 are ignored, current standing waves are generated in such a manner that the current strength changes from an anti-node and a node in this order in a direction from a point connected with the first conductor via 103 to the open end along the transmission line 403 at a lower-limit frequency of a first band gap ($1^{st}$ BG). On the other hand, at an upper-limit frequency of the first band gap ($1^{st}$ BG), current standing waves are generated in such a manner that the current strength changes to a node, an anti-node, and a node in this order in the direction from the point connected with the first conductor via 103 to the open end along the transmission line 403.

At a lower-limit frequency of a second band gap ($2^{nd}$ BG), current standing waves are generated in such a manner that the current strength changes to an anti-node, a node, an anti-node, and a node in this order in the direction from the point connected with the first conductor via 103 to the open end along the transmission line 403. On the other hand, at an upper-limit frequency of the second band gap ($2^{nd}$ BG), current standing waves are generated in such a manner that the current strength changes to a node, an anti-node, a node, an anti-node, and a node in this order in the direction from the point connected with the first conductor via 103 to the open end along the transmission line 403.

After that, also for an n-th band gap ($n^{th}$ BG: (n: a natural number)), current standing waves including n number of repetitions of anti-node→node of the current strength are generated in the direction from the point connected with the first conductor via 103 to the open end along the transmission line 403 at a lower-limit frequency. At an upper-limit frequency of the n-th band gap, current standing waves including n number of repetitions of anti-node→node, starting from the node of the current strength, in the direction from the point connected with the first conductor via 103 to the open end along the transmission line 403, are generated.

Specifically, when the location where the slit 107 is added is set in the vicinity ($l_1$=0 mm) of the point connected with the first conductor via 103, the slit 107 is provided at a location corresponding to the anti-node of the current standing wave generated on the second conductor plane 102 at the lower-limit frequency of the n-th band gap ($n^{th}$ BG), thereby enabling the slit 107 to effectively operate as an inductance.

Further, in the configuration shown in FIG. 4, the addition of the inductance to a series part of an equivalent circuit model of the transmission line 403 indicates that the electrical length of the transmission line 403 is extended. In the structure according to this embodiment, the band gap frequency is determined by the electrical length of the transmission line 403. In other words, the band gap frequency can be lowered by adding the inductance 404 by the slit 107. This indicates that when the structure including the slit 107 is compared with the structure including no slit 107, the band gap frequency with the same frequency can be achieved with a shorter transmission line length, or a smaller structure.

Based on the event as described above, the location where the slit 107 is added is set in the vicinity ($l_1$=0 mm) of the point connected with the first conductor via 103, so that the slit 107 operates as an inductance at the lower-limit frequency of the n-th band gap ($n^{th}$ BG) and also operates to lower the lower-limit frequency of the band gap. In this case, at the upper-limit frequency of the n-th band gap ($n^{th}$ BG), as described above, the vicinity ($l_1$=0 mm) of the point connected with the first conductor via 103 corresponds to the location of the node of the current standing wave, and thus the contribution of the inductance to the upper-limit frequency of the band gap is not large. Thus, the effect of widening the band gap width can be obtained at the same time.

(Modified Examples of Embodiment)

Next, a modified example of this embodiment will be described.

(First Modified Example of Embodiment)

First, a modified example related to the arrangement and shape of the first transmission line 104 and the second transmission line 105 will be described as a first modified example. The arrangement and shape of the first transmission line 104 may be arbitrarily determined, as long as one end of the first transmission line is connected with the first conductor via 103 and the other end of the first transmission line is connected with the second conductor via 106. The arrangement and shape of the second transmission line 105 may be arbitrarily determined, as long as one end of the second transmission line is connected with the second conductor via 106 and the other end of the second transmission line is an open end. FIGS. 1, 2, and 3 in the embodiment described above illustrate a case where the first transmission line 104 and the second transmission line 105 have a linear shape. However, for example, the first transmission line and the second transmission line may have a spiral shape as shown in FIG. 6, a meander shape, or a random shape.

When the first transmission line 104 and the second transmission line 105 have a modified shape as mentioned above, it is desirable to change the shape of the slit 107 according to the shape of each of the first transmission line 104 and the second transmission line 105. For example, when the first transmission line 104 and the second transmission line 105 have a spiral shape as shown in FIG. 6, the slit 107 desirably has a spiral shape. When the first transmission line 104 and the second transmission line 105 have a spiral shape, the first conductor via 103 is desirably disposed at the outer periphery of the first transmission line 104 having a spiral shape as shown in FIG. 6.

Figure 6:
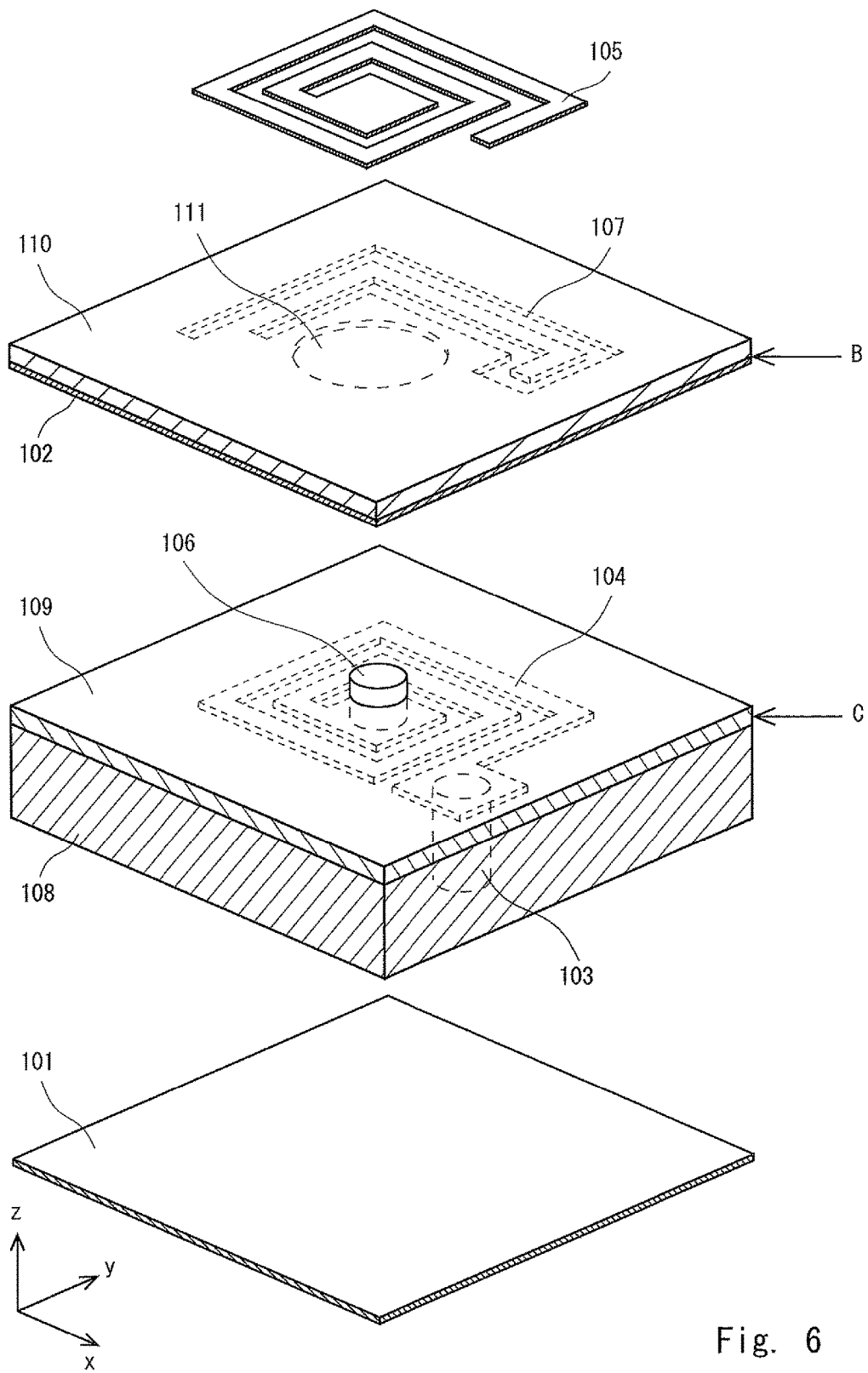
FIG. 6 is a perspective view showing an appearance of a structure according to a first modified example of the embodiment of the present invention.
Figure 7:
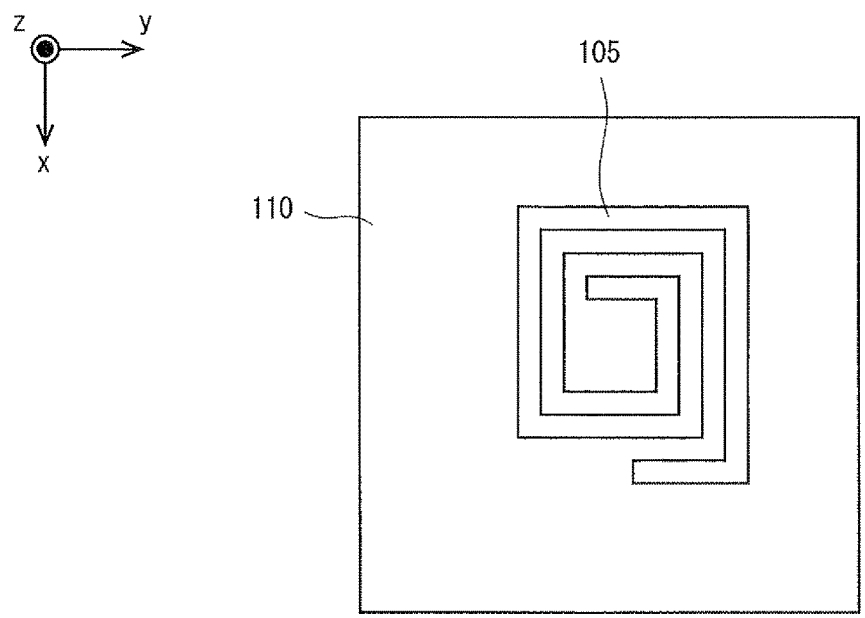
FIG. 7 is a top view showing an example of an upper surface of the structure shown in FIG. 6.
Figure 8:
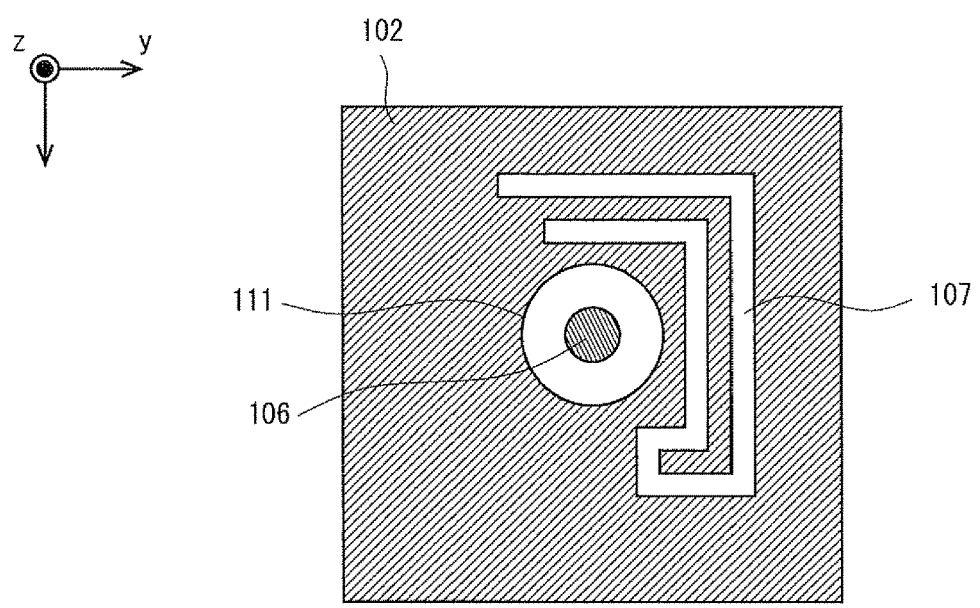
FIG. 8 is a sectional view showing an example of a sectional structure of the structure shown in FIG. 6.
Figure 9:
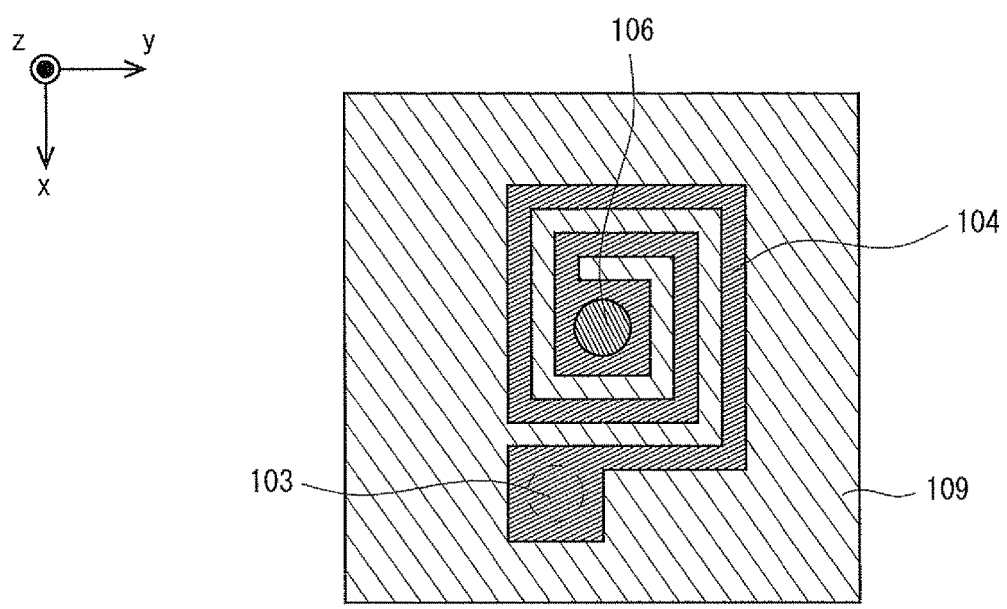
FIG. 9 is a sectional view showing an example of a sectional structure of the structure shown in FIG. 6.

FIG. 6 is a perspective view showing the appearance of the structure according to the first modified example of the embodiment of the present invention. FIG. 6 illustrates the appearance in a state where the main components of the structure according to the first modified example are separated in the z-axis direction, and also illustrates an example in which the first transmission line 104, the second transmission line 105, and the slit 107 each have a spiral shape. FIG. 7 is a top view showing an example of an upper surface of the structure shown in FIG. 6. FIGS. 8 and 9 are sectional views each showing an example of a sectional structure of the structure shown in FIG. 6. FIG. 8 illustrates an xy section at a location indicated by "B" in FIG. 6, and FIG. 9 illustrates an xy section at a location indicated by "C" in FIG. 6.

Specifically, as shown in FIGS. 6, 7, 8, and 9, the slit 107 has a spiral shape corresponding to the spiral shape of each of the first transmission line 104 and the second transmission line 105. Thus, the formation of the first transmission line 104 and the second transmission line 105 with a spiral shape as shown in FIGS. 6, 7, 8, and 9, or a meander shape makes it possible to ensure the transmission line length with a small mounting area and to effectively arrange the EBG structure in a small area. The formation of the first transmission line 104 and the second transmission line 104 with a random shape makes it possible to route the first transmission line 104 and the second transmission line 105 while avoiding other structures, and to effectively arrange the EBG structure in a limited region.

(Second Modified Example of Embodiment)

Figure 10:
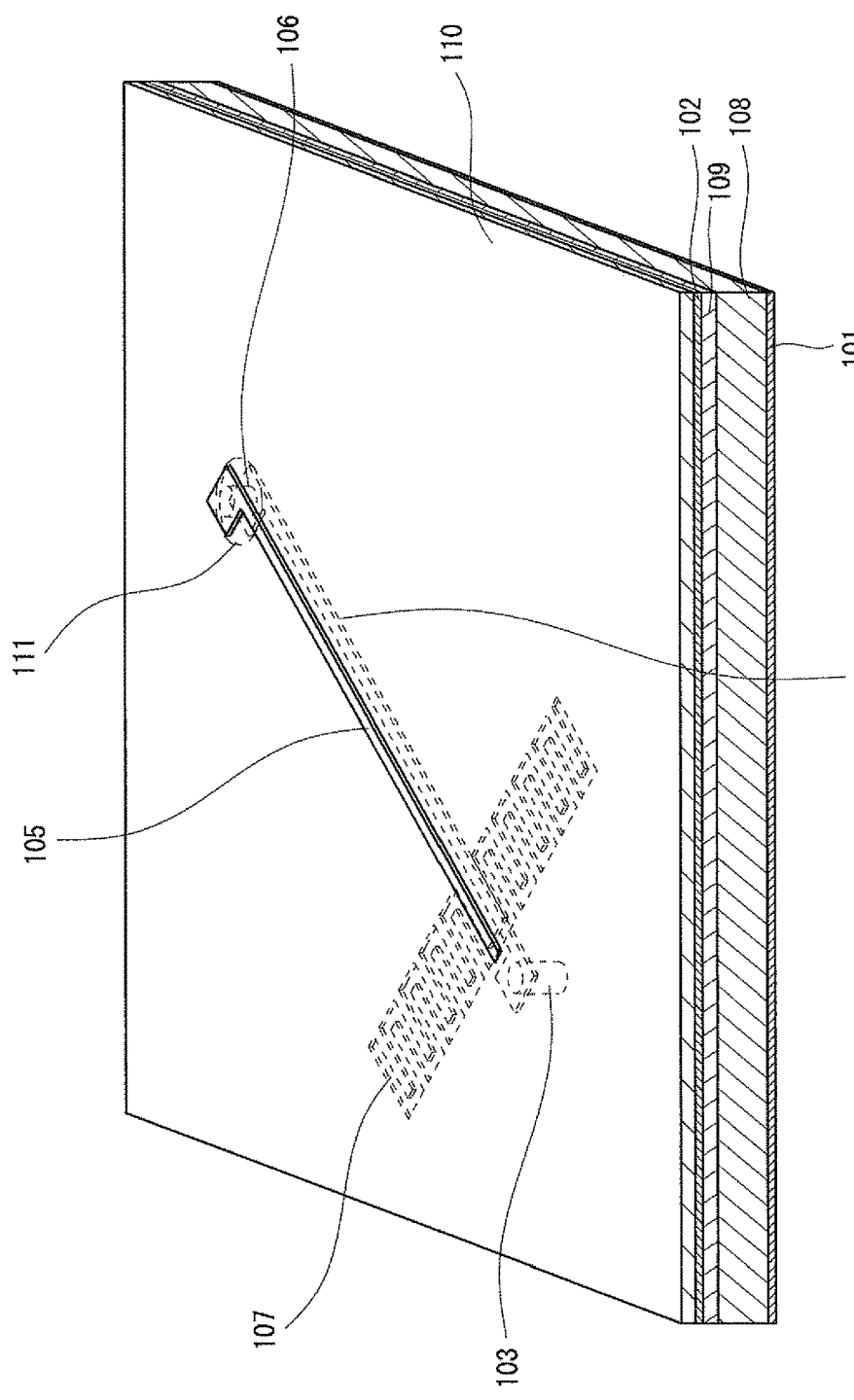
FIG. 10 is a perspective view showing an appearance of a structure according to a second modified example of the embodiment of the present invention.

Next, a modified example related to the arrangement and shape of each slit 107 will be described as a second modified example. The arrangement and shape of each slit 107 may be arbitrarily determined, as long as the slit 107 partially intersects with the first transmission line 104 or the second transmission line 105 in a plan view as viewed along the z-axis direction. FIGS. 1, 2, and 3 in the embodiment described above illustrate a case where the slit 107 has a linear shape. However, for example, the slit 107 may have a meander shape as shown in FIG. 10, a spiral shape, or a random shape. Further, the slit 107 may be arranged so as to intersect with the first transmission line 104 or the second transmission line 105 a plurality of times. FIG. 10 is a perspective view showing the appearance of the structure according to the second modified example of the embodiment of the present invention, and illustrates an example in which the slit 107 has a meander shape. FIG. 10 in the second modified example illustrates a case where the first transmission line 104 and the second transmission line 105 have a linear shape, like in the case shown in FIGS. 1, 2, and 3 in the embodiment described above.

The location where the slit 107 and the first transmission line 104 or the second transmission line 105 intersect with each other in a plan view need not necessarily be set in the vicinity of the connection point between the first transmission line 104 and the first conductor via 103, but instead may be apart from the connection point between the first transmission line 104 and the first conductor via 103.

The number of the slits 107 need not necessarily be one. For example, a plurality of slits 107a and 107b may be arranged for the same first transmission line 104 or second transmission line 105. When a plurality of slits 107 are arranged, the slit 107a and the slit 107b, which are the plurality of slits, each function as an inductance which is added to the first transmission line 104 or the second transmission line 105. It can be expected that, when the slit 107b is provided in addition to the slit 107a, the effect of lowering the band gap frequency can be increased as compared with a case where only the slit 107a is formed.

The example described above illustrates a case where two slits 107 are formed. However, the number of the slits 107 is not limited to two, but instead three, four, or more slits 107 may be arranged.

(Third Modified Example of Embodiment)

Figure 11:
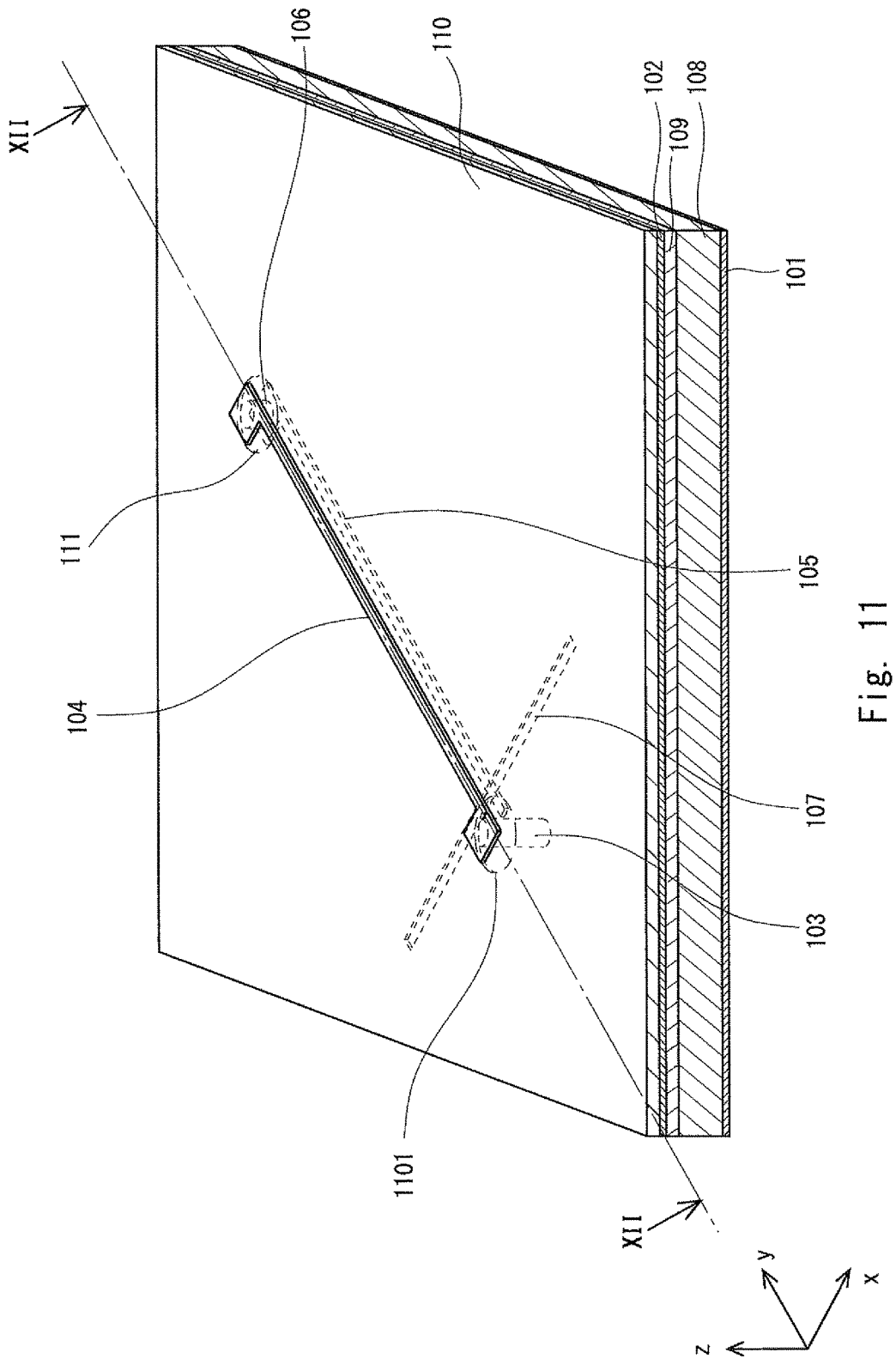
FIG. 11 is a perspective view showing an appearance of a structure according to a third embodiment of the embodiment of the present invention.
Figure 12:
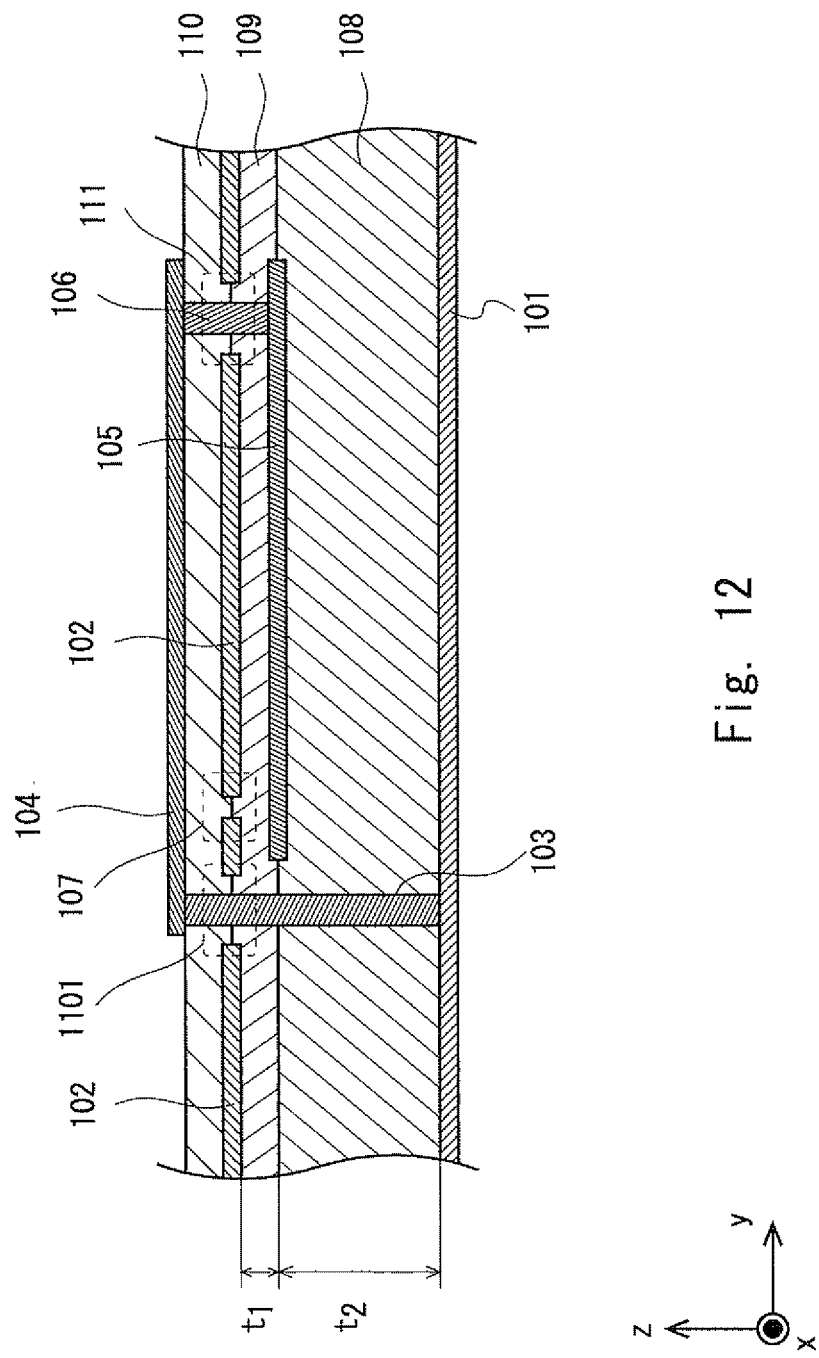
FIG. 12 is a sectional view showing an example of a sectional structure of the structure shown in FIG. 11.

Next, a modified example related to a layer in which the first transmission line 104 and the second transmission line 105 are disposed will be described as a third modified example. FIGS. 1, 2, and 3 in the embodiment described above illustrate a case where the first transmission line 104 is disposed on the other side (lower surface side) of the second conductor plane 102, i.e., between the first conductor plane 101 and the second conductor plane 102, and the second transmission line 105 is disposed on one side (upper surface side) of the second conductor plane 102. However, for example, as shown in FIGS. 11 and 12, the first transmission line 104 may be disposed on one side (upper surface side) of the second conductor plane 102. FIG. 11 is a perspective view showing the appearance of the structure according to the third modified example of the embodiment of the present invention, and illustrates an example in which the first transmission line 104 is provided not on the other side (lower surface side) of the conductor plane 102, but on one side (upper surface side) of the conductor plane 102. FIG. 12 is a sectional view showing an example of a sectional structure of the structure shown in FIG. 11. The sectional view of FIG. 12 illustrates a section taken along a line XII-XII shown in FIG. 11.

When the first transmission line 104 is disposed on one side (upper surface side) of the second conductor plane 102, as shown in FIG. 12, the second transmission line 105 is disposed on the other side (lower surface side) of the second conductor plane 102, i.e., between the first conductor plane 101 and the second conductor plane 102. However, when the first transmission line 104 is disposed on one side (upper surface side) of the second conductor plane 102, as shown in FIG. 12, it is necessary to arrange the clearance 111 on the second conductor plane 102 so as to separate the second conductor plane 102 from the second conductor via 106, which are interposed at an intermediate part, in a direct current way, and it is also necessary to arrange a clearance 1101 on the second conductor plane 102 so as to separate the second conductor plane 102 from the first conductor via 103, which are interposed at an intermediate part, in a direct current way.

This will be described in more detail below. The EBG structure shown in FIGS. 11 and 12 includes: the first dielectric layer 108; the second dielectric layer 109 which is stacked on one side (upper surface side) of the first dielectric layer 108 in the thickness direction; and the third dielectric layer 110 which is stacked on one side (upper surface side) of the second conductor plane 102 in the thickness direction, between the first transmission line 104 and the first conductor plane 101, like in the EBG structure shown in FIGS. 1 and 2. Like in the EBG structure shown in FIGS. 1 and 2, the first conductor plane 101 is disposed on the other side (lower surface side) of the first dielectric layer 108 in the thickness direction. The second conductor plane 102 is disposed on one side (upper surface side) of the second dielectric layer 109. In other words, the second conductor plane 102 is disposed between one side (upper surface side) of the second dielectric layer 109 and the other side (lower surface side) of the third dielectric layer 110.

Unlike in the EBG structure shown in FIGS. 1 and 2 in which the first transmission line 104 is formed between the first conductor plane 101 and the second conductor plane 102, the first transmission line 104 is disposed on one side (upper surface side) of the third dielectric layer 110 in the thickness direction (z-axis direction) as shown in FIG. 12. On the other hand, the second transmission line 105 is formed between the first conductor plane 101 and the second conductor plane 102. One end of the first transmission line 104 is connected with the first conductor plane 101 through the first conductor via 103. The other end of the first transmission line 104 is connected with one end of the second transmission line 105 through the second conductor via 106. The other end of the second transmission line 105 is an open end. The first transmission line 104, the second conductor via 106, and the second transmission line 105 operate as a transmission line with an open end (open stub) using the second conductor plane 102 as a return path.

Further, the slit 107 is provided on the second conductor plane 102, like in the EBG structure shown in FIGS. 1 and 2, and stretches to the both sides of the first transmission line 104 in the x-axis direction, which is perpendicular to the y-axis direction of the first transmission line 104, from a starting point where the slit 107 overlaps one end of the first transmission line 104 or the other end of the second transmission line 105 in the z-axis direction (thickness direction) so as to partially intersect with the first transmission line 104 or the second transmission line 105 in a plan view. Like in the EBG structure shown in FIGS. 1 and 2, the first conductor via 103 stretches in the z-axis direction (thickness direction) so as to connect one end of the first transmission line 104 to the first conductor plane 101, and extends from the upper surface of the third dielectric layer 110 to the lower surface of the first dielectric layer 108 through the second dielectric layer. However, in the EBG structure shown in FIGS. 11 and 12, in order to prevent the first conductor via 103 and the second conductor plane 102 from being short-circuited in a direct current way, it is necessary to provide the clearance 1101 as shown in FIG. 12 at the location of the second conductor plane 102 through which the first conductor via 103 passes.

The embodiment described above illustrates a case where, as shown in FIGS. 1 to 3, no material is formed on the upper surface of the second transmission line 105 and on the lower surface of the first conductor plane 101. However, any material may be formed on the upper surface of the second transmission line and on the lower surface of the first conductor plane. For example, it is assumed that a dielectric or a metallic pattern may be further disposed so as to increase the effective dielectric constant of the first transmission line 104 or the second transmission line 105, or prevent radiation of unnecessary electromagnetic waves from the first transmission line 104 or the second transmission line 105. The first to third modified examples shown in FIGS. 6 to 12 also illustrate a case where no material is formed on the upper surface of the first transmission line 104 or the second transmission line 105 and on the lower surface of the first conductor plane 101. However, any material may be formed on the upper surface of the first transmission line or the second transmission line and on the lower surface of the first conductor plane. For example, it is assumed that a dielectric or a metallic pattern may be further disposed.

(Fourth Modified Example of Embodiment)

Next, a modified example of each of the first transmission line 104 and the second transmission line 105 will be described as a fourth modified example. In the fourth modified example, for example, two first transmission lines, i.e., a first transmission line 104a and a first transmission line 104b, are present as the first transmission line 104.

One end of the first transmission line 104a and one end of the first transmission line 104b are each connected with the first conductor via 103. The other end of the first transmission line 104a and the other end of the second transmission line 104b are connected with the second conductor via 106a and the second conductor via 106b, respectively.

The second conductor via 106a and the second conductor via 106b may be connected with the second transmission line 105a and the second transmission line 105b, respectively.

In this case, a first pair (i.e., a set of the first transmission line 104a, the second conductor via 106a, and the second transmission line 105a, which are provided with a suffix "a") and a second pair (i.e., a set of the first transmission line 104b, the second conductor via 106b, and the second transmission line 105b, which are provided with a suffix "b") may be provided with the slit 107a and the slit 107b, respectively, or a single slit 107 may be disposed so as to partially intersect with both the first pair and the second pair in a plan view.

It is also possible to employ a configuration in which the first transmission line 104 or the second transmission line 105 is branched at an intermediate part. The configuration in which the transmission line is branched enables adjustment of the interval between the first band gap and the second band gap, and adjustment of the width of the first band gap and the width of the second band gap, depending on the location where the transmission line is branched. The number of branches is not limited to 1 or 2. The transmission line may be branched into, for example, one to three, four, or more branches, or other patterns may also be used. It is also possible to employ a configuration in which each slit 107 is branched.

Configurations of preferred embodiments of the present invention have been described above. However, it should be noted that the embodiments are merely examples of the present invention and are not intended to limit the present invention. A person skilled in the art can easily understand that the present invention can be modified or altered in various ways according to specific applications without departing from the scope of the invention.

REFERENCE SIGNS LIST

101 FIRST CONDUCTOR PLANE (FIRST CONDUCTOR)
102 SECOND CONDUCTOR PLANE (SECOND CONDUCTOR)
103 FIRST CONDUCTOR VIA
104 FIRST TRANSMISSION LINE
105 SECOND TRANSMISSION LINE
106 SECOND CONDUCTOR VIA
107 SLIT (INDUCTANCE IMPARTING MEMBER)
108 FIRST DIELECTRIC
109 SECOND DIELECTRIC
110 THIRD DIELECTRIC
111 CLEARANCE
301 UNIT STRUCTURE
401 REPETITION UNIT
402 PARALLEL FLAT LINE
403 TRANSMISSION LINE
404 INDUCTANCE (INDUCTANCE BY SLIT 107)
405 INDUCTANCE (INDUCTANCE BY FIRST CONDUCTOR VIA 103)
1101 CLEARANCE

The invention claimed is:

1. A structure comprising:
a first conductor plane;
a second conductor plane disposed so as to face the first conductor plane;
a first transmission line that is formed in a layer different from the first conductor plane and the second conductor plane and is disposed so as to face the second conductor plane;
a second transmission line that is formed in a layer different from the first conductor plane and the second conductor plane and is disposed so as to face the second conductor plane in a layer opposite to the first transmission line with respect to the second conductor plane;
a first conductor via that connects one end of the first transmission line with the first conductor plane;
a second conductor via that connects another end of the first transmission line and one end of the second transmission line; and
a slit that is formed on the second conductor plane so as to partially intersect with one of the first transmission line and the second transmission line in a plan view,
wherein the slit is provided so as to stretch to both sides of the first transmission line in a direction differing from a longitudinal direction of the first transmission line.

2. The structure according to claim 1, wherein the first conductor plane, the second conductor plane, the first transmission line, the second transmission line, the first conductor via, the second conductor via, and the slit constitute an EBG (Electromagnetic Band Gap) structure.

3. The structure according to claim 1, wherein a distance between the second conductor plane and the first transmission line is smaller than a distance between the first conductor plane and the first transmission line.

4. The structure according to claim 1, wherein an electrical length of the slit is twice or less as long as an electrical length of an open stub formed of the first transmission line, the second transmission line, and the second conductor via.

5. The structure according to claim 1, wherein when an electrical length of the slit is represented by L, the slit overlaps one of the first transmission line and the second transmission line in a plan view at least at a location where (L/2−L/4) or more and (L/2+L/4) or less from a slit end of the slit are satisfied.

6. The structure according to claim 1, wherein when an electrical length of an open stub formed of the first transmission line, the second transmission line, and the second conductor via is represented by D, the first transmission line overlaps the slit in a plan view at least at a location within a range of (D/8) or less from a connection point between the first transmission line and the first conductor via.

7. The structure according to claim 1, wherein a shape of each of the first transmission line and the second transmission line is a spiral shape.

8. The structure according to claim 7, wherein the first conductor via is disposed at an outer periphery of the first transmission line having the spiral shape.

9. A wiring substrate comprising a structure including:
a first conductor plane;
a second conductor plane disposed so as to face the first conductor plane;
a first transmission line that is formed in a layer different from the first conductor plane and the second conductor plane and is disposed so as to face the second conductor plane;
a second transmission line that is formed in a layer different from the first conductor plane and the second conductor plane and is disposed so as to face the second conductor plane in a layer opposite to the first transmission line with respect to the second conductor plane;
a first conductor via that connects one end of the first transmission line with the first conductor plane;
a second conductor via that connects another end of the first transmission line with one end of the second transmission line; and
a slit that is formed on the second conductor plane so as to partially intersect with one of the first transmission line and the second transmission line in a plan view,
wherein the slit is provided so as to stretch to both sides of the first transmission line in a direction differing from a longitudinal direction of the first transmission line.

10. The wiring substrate according to claim 9, wherein the first conductor plane, the second conductor plane, the first transmission line, the second transmission line, the first conductor via, the second conductor via, and the slit constitute an EBG (Electromagnetic Band Gap) structure.

* * * * *